(12) United States Patent
Chang et al.

(10) Patent No.: US 8,853,853 B2
(45) Date of Patent: Oct. 7, 2014

(54) BUMP STRUCTURES

(75) Inventors: Chih-Horng Chang, Taipei (TW);
Tin-Hao Kuo, Hsinchu (TW);
Chen-Shien Chen, Zhubei (TW);
Yen-Liang Lin, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 509 days.

(21) Appl. No.: 13/192,302

(22) Filed: Jul. 27, 2011

(65) Prior Publication Data

US 2013/0026619 A1    Jan. 31, 2013

(51) Int. Cl.
*H01L 23/48*    (2006.01)
(52) U.S. Cl.
USPC .................................. 257/737; 257/E23.068
(58) Field of Classification Search
USPC .......................................... 257/737, E23.068
See application file for complete search history.

(56) References Cited

U.S. PATENT DOCUMENTS

| | | | |
|---|---|---|---|
| 5,569,964 A | 10/1996 | Ikebe | |
| 7,057,292 B1 | 6/2006 | Elenius et al. | |
| 2008/0073783 A1 | 3/2008 | Matsushima et al. | |
| 2008/0088016 A1 | 4/2008 | Ho et al. | |
| 2010/0187688 A1 | 7/2010 | Hochstenbach | |
| 2010/0193944 A1 | 8/2010 | Castro et al. | |
| 2011/0248399 A1 | 10/2011 | Pendse | |
| 2011/0260321 A1 | 10/2011 | Pendse | |
| 2012/0032325 A1 | 2/2012 | Miyata et al. | |

OTHER PUBLICATIONS

Office Action dated Feb. 14, 2014 from corresponding application No. TW 101112185.

*Primary Examiner* — Marvin Payen
(74) *Attorney, Agent, or Firm* — Lowe Hauptman & Ham, LLP

(57) ABSTRACT

The embodiments of bump and bump-on-trace (BOT) structures provide bumps with recess regions for reflowed solder to fill. The recess regions are placed in areas of the bumps where reflow solder is most likely to protrude. The recess regions reduce the risk of bump to trace shorting. As a result, yield can be improved.

20 Claims, 5 Drawing Sheets

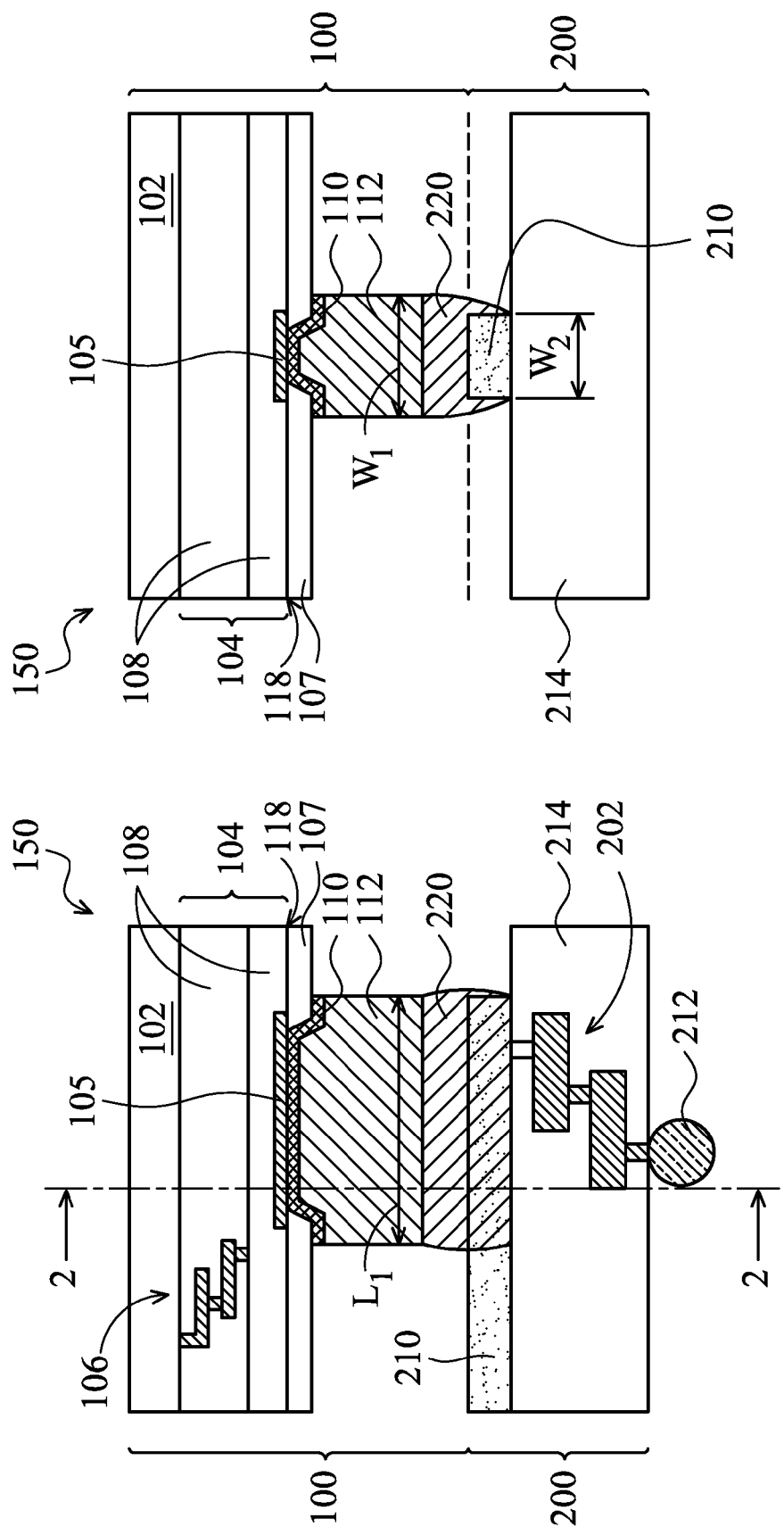

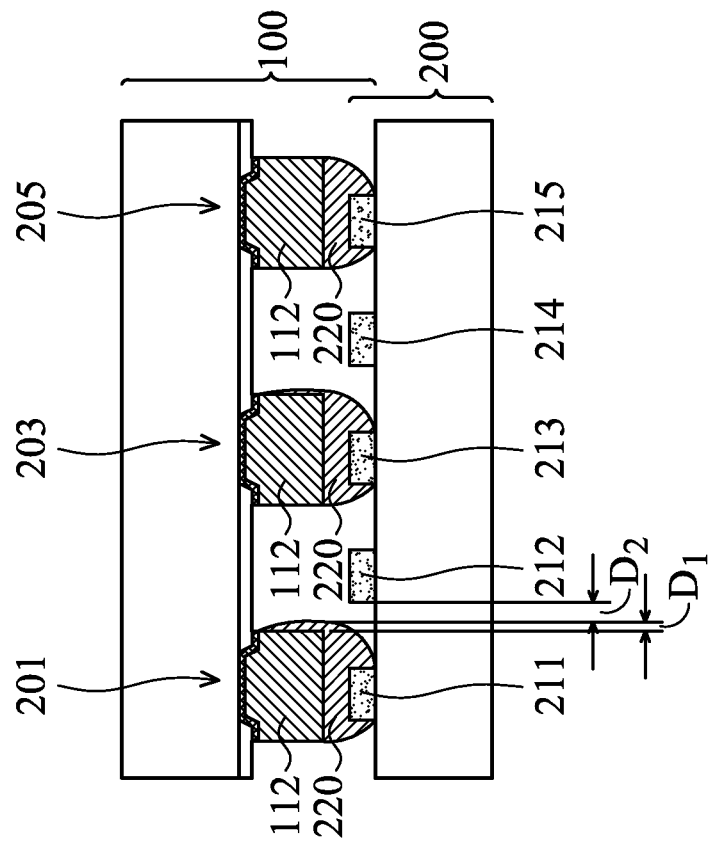
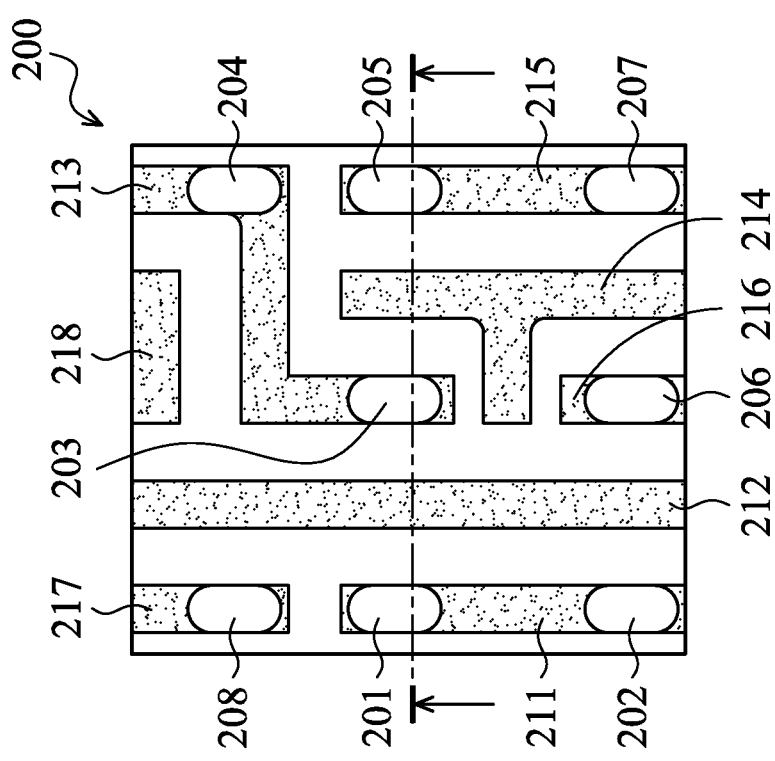
Fig. 2B
Fig. 2A

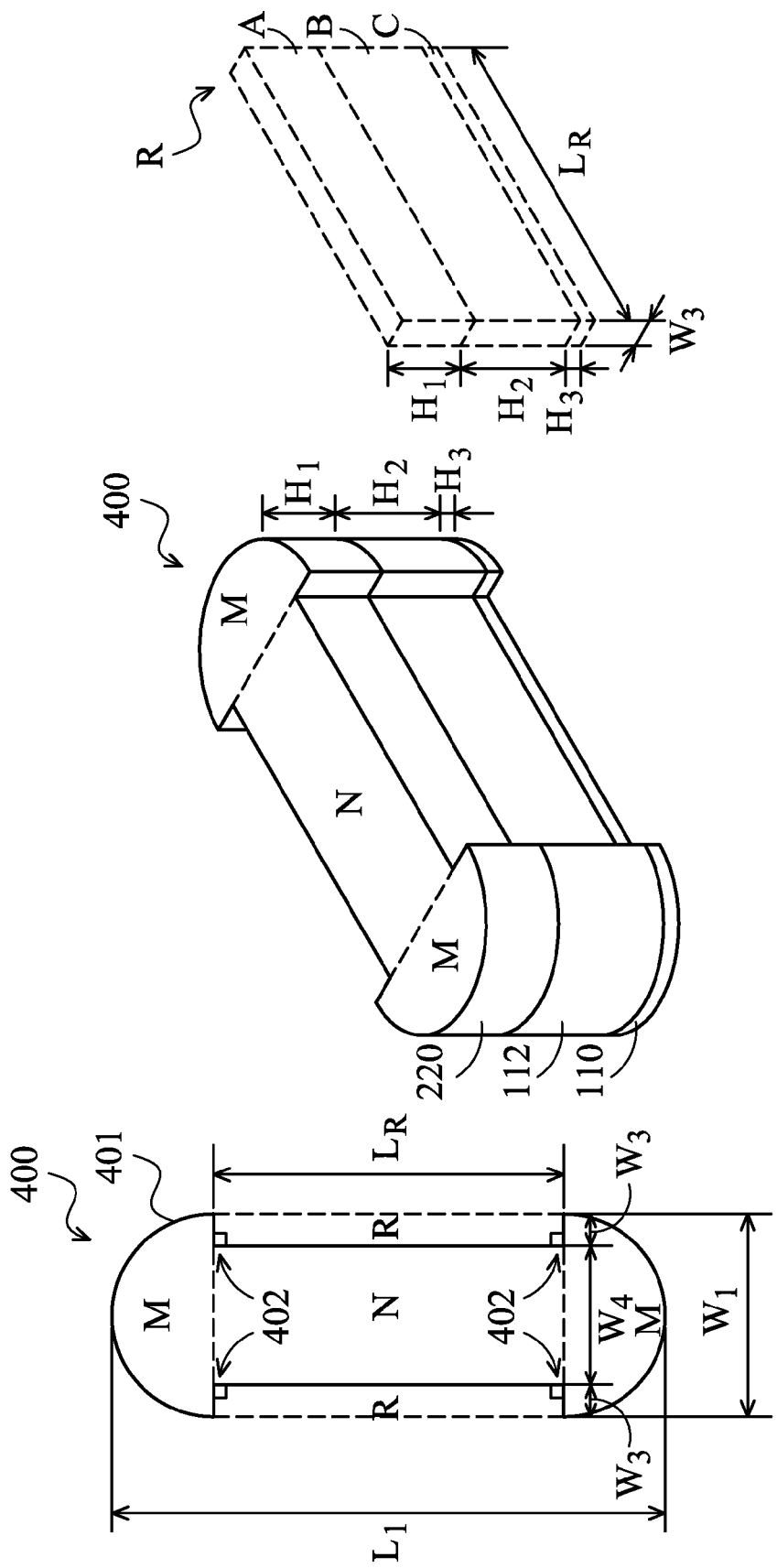

BUMP STRUCTURES

CROSS REFERENCES TO RELATED APPLICATIONS

The present application is related to U.S. application Ser. No. 13/035,586, entitled "EXTENDING METAL TRACES IN BUMP-ON-TRACE STRUCTURES," filed on Feb. 25, 2011. The present application is also related to U.S. application Ser. No. 13/095,185, entitled "REDUCED-STRESS BUMP-ON-TRACE (BOT) STRUCTURES," filed on Apr. 27, 2011. Both U.S. applications are incorporated herein by reference in their entireties.

BACKGROUND

Bump-on-Trace (BOT) structures have been used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is relatively low. However, there are technical challenges related to BOT structures.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A and 1B illustrate cross-sectional views of a package structure in accordance with an embodiment.

FIGS. 2A and 2B illustrate top and cross-sectional views of a bump-on-trace (BOT) region, in accordance with some embodiments.

FIGS. 4A-4E illustrate various embodiments of metal bumps with recess regions to reduce solder protrusion, in accordance with some embodiments.

DETAILED DESCRIPTION OF ILLUSTRATIVE EMBODIMENTS

Figure 3C:
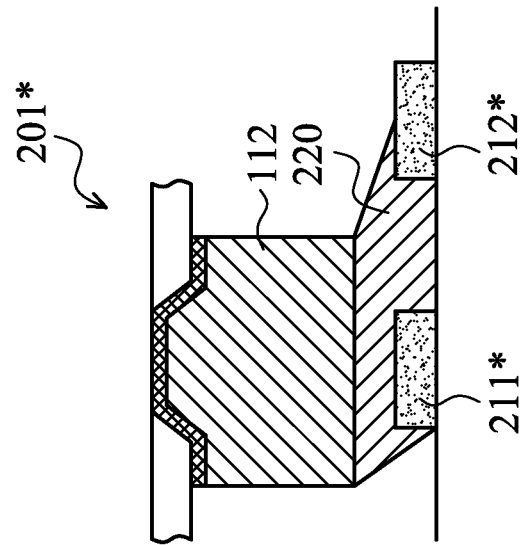
FIG. 3C illustrates protruding solder shorting with a neighboring metal trace, in accordance with some embodiments.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Cross-sectional views of a package structure comprising a Bump-on-Trace (BOT) structure 150 is provided in FIGS. 1A and 1B, in accordance with some embodiments. The package structure 150 includes work piece 100 bonded to work piece 200. Work piece 100 may be a device die that includes active devices such as transistors (not shown) therein, although work piece 100 may also be an interposer that does not have active devices therein. In an embodiment wherein work piece 100 is a device die, substrate 102 may be a semiconductor substrate such as a silicon substrate, although it may include other semiconductor materials. Interconnect structure 104, which includes metal lines and vias 106 formed therein and connected to the semiconductor devices, is formed on substrate 102. Metal lines and vias 106 may be formed of copper or copper alloys, and may be formed using damascene processes. Interconnect structure 104 may include a commonly known inter-layer dielectric (ILD, not shown) and inter-metal dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5.

Work piece 100 may further include under-bump metallurgy (UBM) layer 110 and a copper post (or pillar) 112 on UBM layer 110. Throughout the description, the copper post 112 is also referred to as a copper-containing bump or metal bump. Although copper post 112 is used as an example in the description here and below, other types of metal bumps, such as solder bumps, may also be used in place of copper post 112. The UBM layer 110 is disposed on a metal pad 105, which is part of interconnect structure 104. Between the interconnect structure 104 and the UBM layer 110 not contacting the metal pad 105, there is a passivation layer 107. In some embodiments, the passivation layer 107 is made of polyimide.

Work piece 200 may be a package substrate, although it may be other package components such as interposers, for example. Work piece 200 may include metal lines and vias 202 connecting metal features on opposite sides of work piece 200. In an embodiment, metal trace(s) 210 on the topside of work piece 200 is electrically connected to ball grid array (BGA) balls 212 on the bottom side of work pieces 200 through metal lines and vias 202. Metal lines and vias 202 may be formed in dielectric layers 214, although they may also be formed in a semiconductor layer (such as a silicon layer, not shown) and in the dielectric layers that are formed on the semiconductor layer.

Metal trace 210 is formed over a top dielectric layer in dielectric layers 214. Metal trace 210 may be formed of substantially pure copper, aluminum copper, or other metallic materials such as tungsten, nickel, palladium, gold, and/or alloys thereof. FIG. 1A shows that the copper post (or metal bump) 112 has a length of $L_1$, in accordance with some embodiments. Work pieces 100 and 200 are bonded to each other through solder layer 220, which may be formed of a lead-free solder, a eutectic solder, or the like. Solder layer 220 is bonded to, and contacts, the top surfaces of metal trace 210 and copper post 112.

FIG. 1B illustrates a cross-sectional view of the package structure 150 shown in FIG. 1A, wherein the cross-sectional view is obtained from the plane crossing line 2-2 in FIG. 1A. As shown in FIG. 1B, solder layer 220 may also contact the sidewalls of metal trace 210 after solder reflow. The reflowed solder layer 220 may also move along surfaces 113 of copper post 112 and cover portions or all of surfaces 113 (not shown). In some embodiments, there is a capping layer between copper post 112 and solder layer 220. The capping layer could be used to prevent the formation of inter-metallic compound(s) from copper and solder. In some embodiments, the capping layer includes nickel (Ni). Exemplary details of materials and processes used in forming work piece 100 are described in U.S. application Ser. No. 13/095,185, entitled "REDUCED-STRESS BUMP-ON-TRACE (BOT) STRUCTURES," filed on Apr. 27, 2011, which is incorporated herein by reference in its entirety.

After the bonding of work pieces 100 and 200, a mold underfill (MUF) (not shown) may be filled into the space between work pieces 100 and 200, in accordance with some embodiments. Accordingly, a MUF may also be filled into the space between neighboring metal traces 210. Alternatively, no MUF is filled, while air fills the space between work pieces 100 and 200, and fills the space between neighboring metal traces 210. FIG. 1B shows that the copper post (or metal bump) 112 has a width of $W_1$, in accordance with some embodiments. FIG. 1B also shows that the metal trace 210 has a width $W_2$, in accordance with some embodiments.

In some other embodiments, the ratio of $L_1/W_1$ is greater than 1. In some embodiments, the ratio of $L_1/W_1$ is equal to or greater than about 1.2. In some embodiments, the $L_1$ is in a range from about 10 µm to about 1000 µm. In some embodiments, W1 is in a range from about 10 µm to about 700 µm. In some embodiments, $W_2$ is in a range from about 10 µm to about 500 µm. The structure as shown in FIGS. 1A and 1B is referred to as being a BOT structure, because solder layer 220 is formed directly on the top surface and sidewalls of metal trace 210, and not on a metal pad that has a width significantly greater than width $W_2$ of metal trace 210. In some embodiments, the ratio of $W_1/W_2$ is in a range from about 0.25 to about 1.

FIG. 2A shows a top view of a BOT region 200, in accordance with some embodiments. FIG. 2A shows a number of metal bumps 201-208 over metal traces 211-218. The metal traces provide the function of interconnection and connects metal bumps to one another. For example, metal trace 211 connects metal bump 201 and metal bump 202, in accordance with some embodiments. Metal bumps 201-208 include copper post 112, UBM layer 110 and solder layer 220 described above.

FIG. 2B shows a cross-sectional view of the BOT region 200 cut along A-A line, in accordance with some embodiments. FIG. 2B shows that metal bumps 201, 203, and 205 are placed on metal traces 211, 213, and 215. FIG. 2B also shows cross-sections of metal traces 212 and 214. Cross sections of metal bumps 201, 203, and 205 show a UBM layer 110, copper posts 112 with solder layer 220. The solder layer 220 wrap around the exposed surfaces of metal traces 211, 213 and 215 after reflow. FIG. 2B also shows that the solder layer 220 between copper post 112 of metal bump 201 protrudes beyond surface 231 of copper post 112 with a distance "$D_1$". As mentioned above, the reflowed solder of the solder layer 220 may also move along surfaces 113 of copper post 112 and cover portions or all of surfaces 113. Due to the pressure exerted by the work piece 100 on work piece 200, the surface 221 of solder layer 220 extends beyond the surface 113 of the copper post with a maximum distance of "$D_1$." Larger $D_1$ reduces the distance $D_2$ between the surface 113 and the neighboring metal trace surface 232 and increases the risk of shorting between metal traces 211 and 212. In addition, $D_2$ may be shortened by mis-alignment or by alignment error. With shrinking feature sizes and pitches, minimizing $D_1$ is important to improve yield. In some embodiments, $D_2$, the minimum distance between a bump and a neighboring metal trace, is specified to be equal to or greater than about 0.1 µm to avoid shorting. In some embodiments, the distance between the edge of copper post 112 to a closest edge of a metal trace 212, or $D_1+D_2$, is in a range is equal to or greater than about 1 µm. In some other embodiments, the distance is equal to or greater than about 5 µm.

Figure 3B:
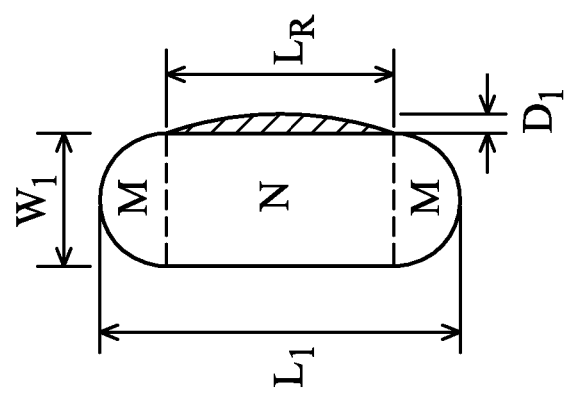
FIGS. 3A and 3B illustrate cross-sectional and top views of a metal bump, in accordance with some embodiments.
Figure 3A:
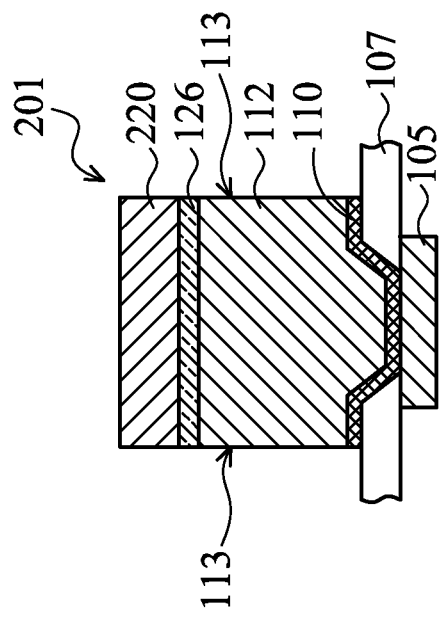

FIG. 3A shows a cross-sectional view of metal bump 201 before it is coupled to metal trace 211 and before solder reflow, in accordance with some embodiments. FIG. 3A shows that metal bump 201 includes a copper post 112 and a solder layer 220. There is an optional capping layer 126 between the copper post 112 and the solder layer 220. The cap layer 126 could act as a barrier layer to prevent copper in the Cu pillar 125 from diffusing into a bonding material, such as solder alloy, that is used to bond the substrate 101 to external features.

The solder layer 220 and copper post 112 may be formed by plating over the UBM layer 110, in accordance with some embodiments. Prior to the solder reflow, the solder layer 220 and copper post 112 share the same surfaces 113. FIG. 3B shows a top view of metal bump 201 of FIGS. 2A and 2B before bonding and reflow, in accordance with some embodiments. FIG. 3B shows the outline 310 of copper post 112. Outline 310 is also the outline for UBM layer 110. The copper post 112 shown in FIG. 3B is in the shape of a race track with two hemispheres (M sections) coupled to a rectangle (N section). The diameter of the two hemispheres $W_1$ is the same as the width of the rectangle, which is also shown in FIG. 1B. The total length of the metal bump 201 is $L_1$, as shown in FIG. 1A, and the length of the rectangle is $L_R$. Although the example in FIG. 3B is in the shape of a race track, other elongated shapes, such as oval shape, etc, are also applicable.

After reflow and under the pressure of being pressed against metal trace 211, solder layer 220 tends to protrude the most near the center region of the rectangle (N section). This could be due to less surface tension on the side walls of the center region (N section), in comparison to the edge sections (M sections).

As described above, the protrusion of the solder layer 220 (with a maximum protruding distance D1) increases the risk of shorting. FIG. 3C shows a cross-sectional view of a BOT structure, in accordance with some embodiments. FIG. 3C shows that the solder layer 220 of a metal bump 201* making contact with a neighboring metal trace 212* due to solder extrusion and some alignment error, which is expected due to process variation. As a result, it is desirable to reduce the protruding distance D1 to reduce of risk of shorting between metal bump 201, metal trace 211, and metal trace 212.

FIG. 4A shows a top view of a metal bump 400, in accordance with some embodiments. The metal bump is similar to metal bumps 201 described above. FIG. 4A shows an outline 401 of outer boundary of the UBM layer 100, which also significantly match the outer boundaries of copper post 112 and solder layer 220 before solder reflow. FIG. 4A shows that in order to reduce solder protrusion to reduce the shortest distance between the metal bump, such as metal bump 201, and a neighboring metal trace, such as metal trace 212, the width of the rectangular section (N section) of the metal bump is reduced from $W_1$ to $W_4$. Each side of the rectangular section is reduced by a width of $W_3$. FIG. 4B shows a side view of metal bump 400, in accordance with some embodiments. Metal bump 400 includes a solder layer 220, a copper post 112 and an UBM layer 110, in accordance with some embodiments. Alternatively, metal bump 400 could refer only to the copper post 112 or the copper post 112 with the UBM layer 110. The height of the solder layer 220 is $H_1$ and the height of the copper post is $H_2$. The height of the UBM layer is $H_3$. In some embodiments, $H_1$ is in a range from about 10 µm to about 50 µm. In some embodiments, $H_2$ is in a range from about 10 µm to about 70 µm. In some embodiments, $H_3$ is in a range from about 3 µm to about 15 µm.

As mentioned above, solder layer 220 tends to protrude in the middle section (or N section). By reducing the width of the middle section, the reflowed solder will fill the recess space created by the reduced width of the middle section (or rectangular section N). As a result, the risk of shorting due to protruding solder material can be reduced and yield can be improved. Such reduction to reduce shorting and to improve yield is important for advanced packaging. In some embodiments, the recess region is region R, which is shown in FIG. 4C. FIG. 4A shows that there are two recess regions R for metal bump 400. Recess region R includes recess region A of the solder layer 220, recess region B of copper post 112, and recess region C of the UBM layer 110, as shown in FIG. 3C in accordance with some embodiments. Equation (1) shows the volume of region R, in accordance with some embodiments.

$$R_{volume} = W_3 \times L_R \times (H_1 + H_2 + H_3) \quad (1)$$

Although reducing $W_1$ could reduce the risk of shorting, $W_1$ cannot be reduced too much to prevent insufficient coverage of solder on the metal trace underneath. In addition, small $W_1$ would lead to small UBM area, which could increase the stress at the interface 118 (as shown in FIGS. 1A and 1B) next to IMDs 108 and could result in interfacial delamination. Such interfacial delamination is a reliability concern and can affect yield. In some embodiments, the maximum width of the recess region $W_3$ is in a range from about 1 μm to about 30 μm. In some embodiments, the ratio of $W_3$ to $W_1$ is in a range from about 0.02 to about 0.5. In some embodiments, the volume ratio of recess regions R to the solder layer 220 of the metal bump 400 is greater than or equal to about 0.01, which means that the recess regions R for metal bump 400 is equal to or greater than about 1% of the volume of the solder layer 220. In some other embodiments, the volume ratio of recess regions R to the solder layer 220 of the metal bump 400 is equal to or less than about 0.1. In some embodiments, a ratio of the surface areas (or cross-sectional areas) of recess regions R, as viewed in FIG. 4A, to the surface area (or cross-sectional area) of bump 400 is equal to or greater than about 0.01. In some other embodiments, a ratio the surface areas (or cross-sectional areas) of recess regions R, as viewed in FIG. 4A, to the surface area (or cross-sectional area) of bump 400 is equal to or less than about 0.1.

Figure 4E:
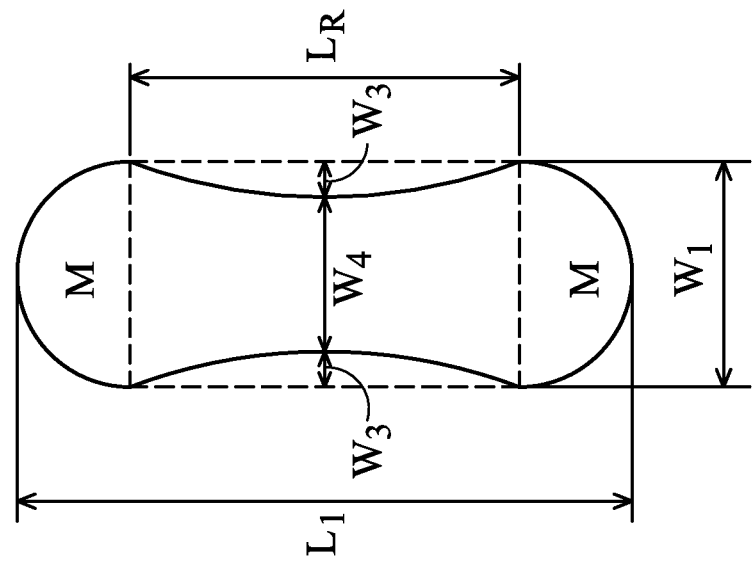
Figure 4D:
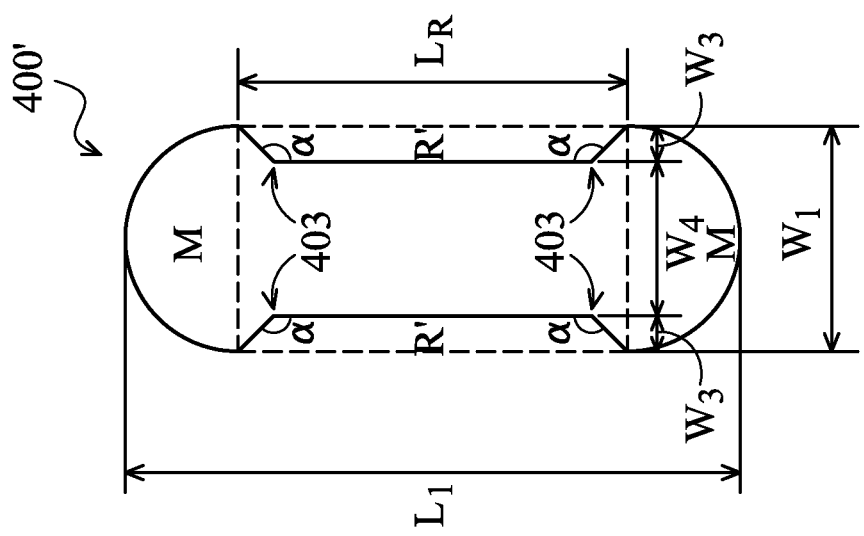

Other shapes of recess regions combined with various profiles of metal bumps may also be used to reduce solder metal protrusion. FIG. 4D shows a top view of a metal bump 400', in accordance with some embodiments. Metal bump 400' is similar to metal bump 400. The corners 402 of regions R of FIGS. 4A, 4B, and 4C are straight (or 90°). The corners 403 of the recess region R' of FIG. 4D is has an angle α. Angle α may be equal to or greater than 90°. A greater than 90° corner angle, α, may have less stress than a straight corner. However, angle α may be designed with an angle less than 90°, in accordance with some embodiments. In some embodiments, the M sections (or end sections) of metal bump 400 do not need to be in hemispherical shape. Other shapes are also possible. Further, the recess regions do not need to be formed by straight walls. FIG. 4E shows a metal bump 400* with the recess regions having curved side walls, in accordance with some embodiments. Other shapes and curvatures of sidewalls of recess regions are also possible.

The metal bumps described above without the recess regions have a cross section in the shape of a race track. Bumps with other shapes of cross sections may also be used. For example, the shape of a cross section may be an oval shape. The top views of metal bumps 400 may be in any elongated shapes, including a rectangle with rounded corners. Recess region(s) may be formed in such bumps to allow solder layers to fill (fully or partially) in the recess region(s) after reflow to reduce the risk of shorting.

The embodiments of bump and bump-on-trace (BOT) structures provide bumps with recess regions for reflowed solder to fill. The recess regions are placed in areas of the bumps where reflow solder is most likely to protrude. The recess regions reduce the risk of bump to trace shorting. As a result, yield can be improved.

In accordance with some embodiments, an elongated bump structure is provided. The elongated bump structure includes a copper layer, and a solder layer. The elongated bump structure has a recess region for the solder layer to fill after the solder layer is reflowed.

In accordance with some other embodiments, a bump-on-trace (BOT) structure is provided. The BOT structure includes a first work piece with a metal trace on a surface of the first work piece and a second work piece with an elongated metal bump. The elongated metal bump has a recess region. The BOT structure also includes a solder bump. The solder bump contacts both the metal trace of the first work piece and the elongated metal bump of the second work piece to form the BOT structure. Solder of the solder bump fills the recess region at least partially.

In accordance with yet other embodiments, a packaged substrate with a bump-on-trace (BOT) structure is provided. The package structure includes a first work piece with a metal trace on a surface of the first work piece, and a second work piece with an elongated metal bump. The elongated metal bump has a recess region, and the elongated metal bump includes a copper post. The package structure also includes a solder bump. The solder bump contacts both the metal trace of the first work piece and the elongated metal bump of the second work piece to form the BOT structure. Solder of the solder bump fills at least partially the recess region of the recess region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An elongated bump structure, comprising:
   a copper layer, and
   a solder layer; wherein the elongated bump structure has a recess region for the solder layer to fill after the solder layer is reflowed.

2. The elongated bump structure of claim 1, wherein the elongated bump structure further comprises an under-bump metallurgy (UBM) layer.

3. The elongated bump structure of claim 1, wherein the elongated bump structure has two ends and a middle section connecting the two ends, wherein the recess region is in the middle section.

4. The elongated bump structure of claim 1, wherein the elongated bump structure has a cross-sectional view with two hemispheres at two ends connected by a middle section, wherein the recess region is in the middle section.

5. The elongated bump structure of claim 3, wherein ratio of a first width of the middle section to a second width of each of the two ends is in a range from about 0.02 to about 0.5.

6. The elongated bump structure of claim 1, wherein the elongated bump structure has another recess region, ad wherein a cross-sectional area ratio of the recess regions to the elongated bump structure is in equal to or greater than about 0.01.

7. The elongated bump structure of claim 1, wherein a cross-sectional area ratio of the recess region to the elongated bump structure is in equal to or less than about 0.1.

8. The elongated bump structure of claim 3, wherein two adjacent walls of the recess region is at an angle equal to or greater than 90°.

9. The elongated bump structure of claim 1, wherein a surface of the recess region is curved.

10. The elongated bump structure of claim 1, wherein the copper layer is a copper post.

11. The elongated bump structure of claim 1, further comprising:
a capping layer between the copper layer and the solder layer.

12. The elongated bump structure of claim 1, wherein a ratio of a maximum length to a maximum width of the elongated bump structure is equal to or greater than about 1.2.

13. The elongated bump structure of claim 1, wherein a minimum distance between an elongated bump and a neighboring metal trace equal to or greater than about 0.1 µm.

14. A bump-on-trace (BOT) structure, comprising:
a first work piece with a metal trace on a surface of the first work piece;
a second work piece with an elongated metal bump, wherein the elongated metal bump has a recess region; and
a solder bump, wherein the solder bump contacts both the metal trace of the first work piece and the elongated metal bump of the second work piece to form the BOT structure, wherein solder of the solder bump fills the recess region at least partially.

15. The BOT structure of claim 14, wherein the elongated metal bump includes a copper post and an UBM layer.

16. The BOT structure of claim 14, wherein the elongated metal bump has two ends and a middle section connecting the two ends, wherein the recess region is in the middle section.

17. The BOT structure of claim 14, wherein a cross-sectional area ratio of the recess region to the elongated bump structure is in equal to or less than about 0.1.

18. The BOT structure of claim 14, wherein two adjacent walls of the recess region is at an angle equal to or greater than 90°.

19. The BOT structure of claim 1, wherein a surface of the recess region is curved.

20. A packaged substrate with a bump-on-trace (BOT) structure, comprising:
a first work piece with a metal trace on a surface of the first work piece;
a second work piece with an elongated metal bump, wherein the elongated metal bump has a recess region, wherein the elongated metal bump includes a copper post; and
a solder bump, wherein the solder bump contacts both the metal trace of the first work piece and the elongated metal bump of the second work piece to form the BOT structure, wherein solder of the solder bump fills at least partially the recess region of the recess region.

* * * * *